United States Patent
Sakai et al.

(10) Patent No.: US 7,605,973 B2
(45) Date of Patent: Oct. 20, 2009

(54) OPTICAL WAVELENGTH CONVERSION LIGHT SOURCE

(75) Inventors: Kiyohide Sakai, Tokyo (JP); Yasuharu Koyata, Tokyo (JP); Masao Imaki, Tokyo (JP); Kouhei Teramoto, Tokyo (JP); Shigenori Shibue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 2 days.

(21) Appl. No.: 11/791,233

(22) PCT Filed: Dec. 3, 2004

(86) PCT No.: PCT/JP2004/018003

§ 371 (c)(1),
(2), (4) Date: May 22, 2007

(87) PCT Pub. No.: WO2006/059389

PCT Pub. Date: Jun. 8, 2006

(65) Prior Publication Data

US 2008/0049796 A1    Feb. 28, 2008

(51) Int. Cl.
*G02F 2/02* (2006.01)
*H01S 3/10* (2006.01)

(52) U.S. Cl. .................... 359/326; 359/328; 372/6; 372/21; 372/22

(58) Field of Classification Search ........ 359/326–330; 372/6, 21, 22
See application file for complete search history.

(56) References Cited

U.S. PATENT DOCUMENTS

| | | | |
|---|---|---|---|
| 5,291,568 A | 3/1994 | Uemiya et al. | |
| 5,485,481 A | 1/1996 | Ventrudo et al. | |
| 5,544,271 A | 8/1996 | Lim | |
| 5,682,398 A | 10/1997 | Gupta | |
| 5,761,226 A | 6/1998 | Gupta | |
| 5,845,030 A | 12/1998 | Sasaki et al. | |
| 6,525,872 B1 | 2/2003 | Ziari et al. | |
| 6,832,021 B2 * | 12/2004 | Behringer | 385/31 |
| 6,965,627 B2 * | 11/2005 | Namiwaka et al. | 372/92 |
| 6,996,140 B2 * | 2/2006 | Waarts et al. | 372/21 |

(Continued)

FOREIGN PATENT DOCUMENTS

JP    3-132628 A    6/1991

(Continued)

OTHER PUBLICATIONS

Yujiang Qu et al., Physical Review A, vol. 47, No. 4, pp. 3259-3263, Apr. 1993.

(Continued)

*Primary Examiner*—Hemang Sanghavi
(74) *Attorney, Agent, or Firm*—Birch, Stewart, Kolasch & Birch, LLP

(57) ABSTRACT

An allowable temperature range satisfying phase matching conditions of a wavelength conversion device is widened. A wavelength conversion light source includes a semiconductor laser diode device (1) applied with an antireflection film (3), a lens (4) arranged opposite to the semiconductor laser diode device (1), an optical fiber (5) having a Bragg grating (6) arranged in a core thereof, and a wavelength conversion device (8) formed of a nonlinear optical crystal on which light from the semiconductor laser diode device (1) is incident. In the wavelength conversion light source, the semiconductor laser diode device (1) oscillates in coherent collapse mode.

17 Claims, 6 Drawing Sheets

U.S. PATENT DOCUMENTS

| | | | |
|---|---|---|---|
| 2001/0019563 A1 | 9/2001 | Hatori | |
| 2002/0136258 A1* | 9/2002 | Starodubov | 372/102 |
| 2003/0035459 A1* | 2/2003 | Wilson et al. | 372/97 |
| 2003/0142910 A1 | 7/2003 | Behringer | |
| 2004/0258109 A1* | 12/2004 | Tojo et al. | 372/32 |
| 2007/0230527 A1* | 10/2007 | Sakai et al. | 372/43.01 |
| 2008/0123703 A1* | 5/2008 | Mohrdiek et al. | 372/29.021 |

FOREIGN PATENT DOCUMENTS

| | | |
|---|---|---|
| JP | 5-173212 A | 7/1993 |
| JP | 5-173212 A | 7/1993 |
| JP | 9-179155 A | 7/1997 |
| JP | 9-283847 A | 10/1997 |
| JP | 11-214802 A | 8/1999 |
| JP | 2000-241842 A | 9/2000 |
| JP | 2001-242500 A | 9/2001 |
| JP | 2003-512717 A | 4/2003 |
| JP | 2003-188469 A | 7/2003 |
| JP | 2003-270686 A | 9/2003 |
| JP | 2003-273458 A | 9/2003 |
| JP | 2004-157217 A | 6/2004 |
| JP | 2004-177633 A | 6/2004 |

OTHER PUBLICATIONS

C. R. Giles et al., IEEE Phtonics Technology Letters, vol. 6, No. 8, pp. 907-909, Aug. 1994.

B. F. Ventrudo et al., Electronics Letters, vol. 30, No. 25, pp. 2147-2149, Dec. 8, 1994.

Toshiaki Suhara et al., IEEE Journal of Quantum Electronics, vol. 26, No. 7, pp. 1265-1276, Jul. 1990.

Sten Helmfrid et al., Journal of Optical Society of America B, vol. 8, No. 11, pp. 2326-2330, Nov. 1991.

* cited by examiner

OPTICAL WAVELENGTH CONVERSION LIGHT SOURCE

TECHNICAL FIELD

The present invention relates to an optical wavelength conversion light source for use in an illuminating device, a printing device, a display device, an optical memory device, or the like.

BACKGROUND ART

A semiconductor laser diode device oscillates in a wide wavelength range from infrared to bluish purple by changing a composition and a structure of a semiconductor. However, because long life and satisfactory characteristics cannot be obtained unless the composition includes a compound semiconductor with good crystallinity, a wavelength band in which the semiconductor laser diode device can actually oscillate is limited, and blue and green wavelength bands with satisfactory chromaticity are still under development. Further, with regard to the blue and green wavelength band, there is no probability yet that a semiconductor laser diode device the output power of which is on the order of watts can be obtained, and there is no device that can be suitably applied to a laser display or the like which requires high brightness. Therefore, as a practical measure, a wavelength conversion light source is gathering attention and is under research and development, in which a wavelength of a fundamental emitted from a semiconductor laser diode device is converted through phase matching with a harmonic using a nonlinear optical crystal having a periodic domain inversion structure (hereinafter referred to as a wavelength conversion device).

A conventional wavelength conversion light source is formed of a semiconductor laser diode device having a high reflection film and an antireflection film applied to end faces thereof, respectively, and a polarization maintaining optical fiber having a Bragg grating disposed in a core portion thereof (see, for example, Patent Document 1). Patent Document 1 describes that the high reflection film and the Bragg grating form a resonator, the semiconductor laser oscillates as a stable and single-mode hybrid laser with a narrow line width, and the wavelength of a fundamental of the laser is converted by a wavelength conversion device. Further, there is also a description that it is not important that the semiconductor laser diode device is a laser, and it may be any gain medium. Further, an example in which a polarization maintaining optical fiber is used, or a waveguide is provided to the wavelength conversion device is described.

Patent Document 1; JP 11-509933 A (pages 6 to 12, FIGS. 1 to 3)

DISCLOSURE OF THE INVENTION

Problem to be Solved by the Invention

However, a wavelength conversion light source formed of a nonlinear optical device has had problems in that an allowable temperature range thereof satisfying phase-matching conditions is narrow.

For example, a wavelength conversion light source disclosed in JP 11-509933 A oscillates a single-mode fundamental with a narrow line width by an external resonance formed of a high reflection film on a rear surface of a semiconductor laser diode device and a Bragg grating disposed in a core of an optical fiber, and the wavelength of the fundamental is converted by a wavelength conversion device. Such a device for converting the wavelength of the single-mode fundamental with a narrow line width is described in detail in, for example, Applied Physics Letter (Vol. 83, No. 18, pp. 3659-3661, 2003), in which the wavelength of light in a single longitudinal mode emitted from a solid-state laser is converted with a nonlinear optical crystal having a periodic domain inversion structure. The allowable temperature at which the wavelength conversion efficiency becomes half of a peak value is 2.3° C. at most of the full width at half-maximum, which is very narrow, so there is a problem in that temperature control with high precision is required.

The present invention is made in view of the above-mentioned points, and an object of the present invention is to provide a wavelength conversion light source which enlarges an allowable temperature range, and has high wavelength conversion efficiency and can be formed easily.

Means for Solving the Problems

To achieve the above-mentioned object, according to the present invention, there is provided a wavelength conversion light source, including: a semiconductor laser diode device applied with an antireflection film; a lens disposed so as to be opposed to the semiconductor laser diode device; an optical fiber with a Bragg grating disposed in a core thereof; and a wavelength conversion device formed of a nonlinear optical crystal on which light from the semiconductor laser diode device is incident, in which the semiconductor laser diode device oscillates in a multi-longitudinal mode.

Further, according to another aspect of the present invention, there is provided a wavelength conversion light source, including: a semiconductor laser diode device applied with a low reflection film; a lens disposed so as to be opposed to the semiconductor laser diode device; an optical fiber with a Bragg grating disposed in a core thereof; and a wavelength conversion device formed of a nonlinear optical crystal on which light from the semiconductor laser diode device is incident, in which the semiconductor laser diode device oscillates in a coherent collapse mode Further, according to still another aspect of the present invention, there is provided a wavelength conversion light source, including: a semiconductor laser diode device applied with an antireflection film; a lens disposed so as to be opposed to the semiconductor laser diode device; an optical fiber with a low reflection film disposed on a light incident surface thereof and a Bragg grating disposed in a core thereof; and a wavelength conversion device formed of a nonlinear optical crystal on which light from the semiconductor laser diode device is incident, in which the semiconductor laser diode device oscillates in a coherent collapse mode.

EFFECTS OF THE INVENTION

According to the present invention, a wavelength conversion light source includes a semiconductor laser diode device, an optical fiber with a Bragg grating disposed in a core thereof, and a wavelength conversion device formed of a nonlinear optical crystal on which light from the semiconductor laser diode device is incident, and the semiconductor laser diode device oscillates in a multi-longitudinal mode or a coherent collapse mode. Therefore, an allowable temperature range satisfying phase-matching conditions of the wavelength conversion device can be enlarged, and a wavelength conversion light source which is stable against ambient conditions can be provided.

BEST MODE FOR CARRYING OUT THE INVENTION

Figure 1:
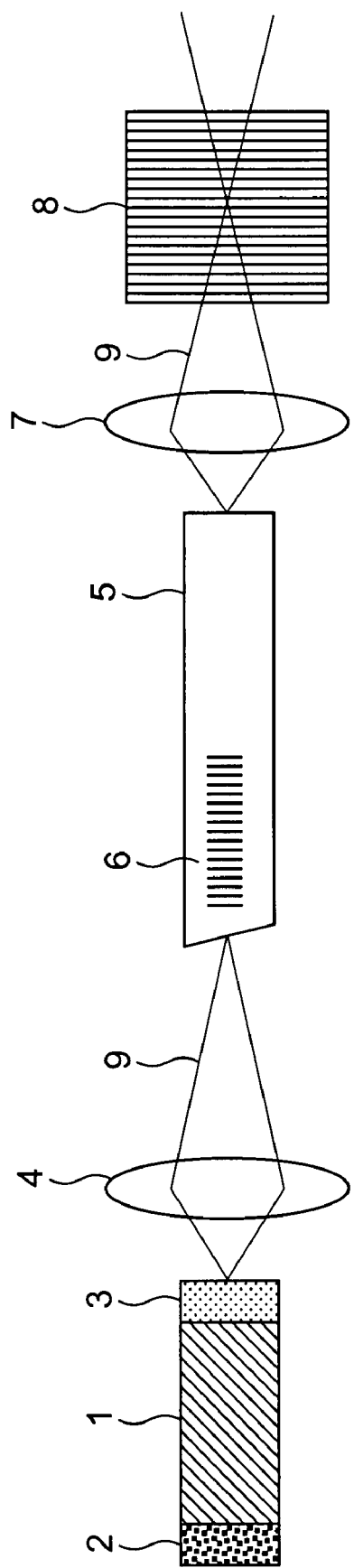
FIG. 1 is a configuration diagram of a wavelength conversion light source according to Embodiment 1 of the present invention.

Preferred embodiments of a wavelength conversion light source according to the present invention are described in detail in the following with reference to the attached drawings. The wavelength conversion light source according to the embodiments of the present invention is, for example, used as a light source disposed in an illuminating device, a printing device, a display device, or an optical memory device.

Embodiment 1

First, operation of wavelength conversion by generating a second harmonic using an optical crystal is described. When a fundamental enters the crystal, linear polarization is induced by the electric field. However, when a strong electric field such as a laser beam enters an optical crystal having an asymmetric center, third-order tensor susceptibility is not negligible, and there is a phenomenon where, with regard to a fundamental having an angular frequency of ω, dielectric polarization of an angular frequency of 2ω and an angular frequency of zero occurs. The former is referred to as second harmonic generation while the latter is referred to as optical rectification.

In order to improve the efficiency of the second harmonic generation caused by the nonlinear polarization, it is necessary to satisfy phase-matching conditions of the fundamental and the second harmonic. Several methods are known including utilization of refractive index wavelength dispersion characteristics and utilization of difference in the refractive index of an ordinary ray and an extraordinary ray. Among them, quasi-phase matching in which the direction of spontaneous polarization of a nonlinear optical crystal is alternately inverted by 180° has characteristics of being able to choose arbitrary operation wavelength by the period of the alternation, being able to select a crystallographic axis having a large nonlinear constant, and the like. Researches are actively conducted for the purpose of forming an optical waveguide in this periodic domain inversion structure to generate a second harmonic with efficiency.

This phenomenon of converting a fundamental into a second harmonic by a periodic domain inversion structure can be analyzed using the mode coupling theory. For example, Suhara et al. disclose in detail a method of calculating the conversion efficiency in Journal of Quantum Electronics, Vol. 26, pp. 1265-1276. According to the calculating method, for example, a wavelength width in which a wavelength conversion device formed of lithium niobate having a wavelength in a range of 900-1000 nm and a length of 10 mm achieves phase matching is approximately 0.1 nm, which is very narrow.

On the other hand, a longitudinal mode spacing $\Delta\lambda$ of a semiconductor laser diode having a Fabry-Perot resonator is determined by Equation (1) where L is a resonator length, n is a refractive index, and $\lambda$ is a wavelength. For example, the longitudinal mode spacing when the wavelength is 980 nm, the length is 900 μm, and a refractive index $n_e$ is from 3.2 to 3.5 is, partly depending on the structure of the semiconductor laser diode, because an effective refractive index $n_g$ is approximately 4 to 4.5, approximately 0.13 nm, which shows that it is difficult to include a plurality of longitudinal modes in an allowable wavelength width of phase matching in a wavelength conversion device.

[Equation 1]

$$\Delta\lambda = \frac{\lambda^2}{2 \cdot n_g \cdot L} \quad (1)$$

$$n_g = n_e - \lambda \cdot \frac{dn_e}{d\lambda}$$

Therefore, a semiconductor laser diode device of a multi-longitudinal mode is hardly used as a fundamental light source, and, as shown in JP 11-509933 A, ones employing single longitudinal mode have been put to practical use. It should be noted that various reports are made on a structure for obtaining the single longitudinal mode including an external resonator using a semiconductor laser diode device and a diffraction grating, a DFB (Distributed Feedback) structure, and a DBR (Distributed Bragg grating Reflector) structure.

On the other hand, when a fundamental is generated by a gas laser of a long resonator, a Ti:sapphire laser, or the like, a fundamental with a lot of longitudinal modes enters a narrow allowable wavelength width satisfying the phase-matching conditions of the wavelength conversion device. In this case, a longitudinal mode having an angular frequency ω of the fundamental is converted into a second harmonic having an angular frequency of 2ω, and at the same time, longitudinal modes having an angular frequency of ω−δω and an angular frequency of ω+δω achieve phase matching as sum frequency having an angular frequency of 2ω (it should be noted that δω is a longitudinal mode spacing of the fundamental). Therefore, it is known that the conversion efficiency of a fundamental in a multi-longitudinal mode satisfying phase-matching conditions is twice at the maximum as much as that of a second harmonic of a single wavelength.

The theory of this phenomenon is reported by Helmfrid et al. in Journal of Optical Society America B, Vol. 8, pp. 2326-2329 and an experiment of this phenomenon is reported by Qu et al. in Physical Review, Vol. 47, pp. 3259-3263. However, the range of application of the large laser device as described above is limited, and, although it is possible to form such a laser device using a fiber laser or the like, it is difficult to form such a laser device using a highly practical semiconductor laser diode device, and thus, less attention has been paid to such a laser device. It should be noted that, although there is a method of forming the external resonator disclosed in JP 2001-242500 A, because the optical length is long, the semiconductor device is liable to unstably operate influenced by ambient temperature changes and mechanical fluctuations. To attain stable operation, the structure has to be more complicated, which is not practical.

Embodiment 1 of the present invention enables multi-longitudinal mode oscillation by the above-mentioned semiconductor laser diode device, and stabilizes the operation in the case of ambient temperature changes and mechanical fluctuations. FIG. 1 is a configuration diagram of a wavelength conversion light source according to Embodiment 1 of the present invention. The wavelength conversion light source illustrated in FIG. 1 includes a semiconductor laser diode device 1 having a high reflection film 2 vapor deposited on a rear surface thereof and an antireflection film 3 vapor deposited on a front surface thereof, a first lens 4 disposed so as to be opposed to the semiconductor laser diode device 1, a polarization maintaining optical fiber 5 having a Bragg grating 6 in a core thereof for optically coupling light outputted from the semiconductor laser diode device 1 through the lens 4, a second lens 7 for converging light diffused from the optical fiber 5, and a wavelength conversion device 8 formed of a nonlinear optical crystal on which light outputted from the optical fiber 5 is incident through the second lens 7. It should be noted that a reference numeral 9 denotes a light beam path. In the figure, the high reflection film 2 and the Bragg grating 6 form a Fabry-Perot resonator.

Next, operation is described. The reflectivity of the antireflection film 3 vapor deposited on the front surface of the semiconductor laser diode device 1 is controlled to be 0.1% or less to suppress the laser oscillation of the semiconductor laser diode device 1 alone, which makes the semiconductor laser diode device 1 function as a gain medium. Further, the reflectivity of the high reflection film 2 is made to be 90% and the reflectivity of the Bragg grating 6 is made to be 5-10% to form the Fabry-Perot resonator and to improve the efficiency of taking light out. It should be noted that the distance between the semiconductor laser diode device 1 and the Bragg grating 6 is set such that a plurality of longitudinal modes are included in an allowable wavelength width satisfying phase-matching conditions of the wavelength conversion device 8.

Suppose that the number of the longitudinal modes is N. The ratio of the wavelength conversion efficiency in a single mode to the wavelength conversion efficiency in the multi-longitudinal mode can be approximated as $2-1/N$, and thus, it is preferable that the number of the longitudinal modes included is larger. In particular, when the number of the longitudinal modes is extremely small, there are problems including that light output changes due to a mode-hopping phenomenon are caused as described in JP 2001-242500 A. Here, for the purpose of enlarging the allowable temperature range while maintaining the wavelength conversion efficiency, the full width at half maximum of a reflection band of the Bragg grating 6 is made to be 0.3 nm to make allowable multi-longitudinal modes. As expected in the above-mentioned calculation by Helmfrid et al., the full width at half maximum of the allowable temperature satisfying the phase-matching conditions becomes approximately twice as much, and special effects were obtained. It should be noted that there are instability and asymmetry of longitudinal modes known as mode partition noise, and a sum frequency component according to the calculation by Helmfrid et al. was considerably small.

Embodiment 2

Next, in Embodiment 2, as a method of generating multi-longitudinal modes which achieve phase matching in the narrow allowable wavelength width of the wavelength conversion device 8, a coherent collapse mode of the semiconductor laser diode device 1 is used. It has been known for a considerably long time that the coherent collapse mode can be oscillated by the semiconductor laser diode device 1 and the Bragg grating 6 formed in the optical fiber portion 5. Researches were temporarily made for use for a wavelength variable light source, but the coherent collapse mode was not put to practical use. Because the relative intensity noise was large, it could not be used for a signal light source, and thus, it was hardly used.

However, since Giles et al. indicated in IEEE Photonics Technology Letter, Vol. 6, pp. 907-909 and the like that it can be used as a pump light source for an erbium doped fiber amplifier for optical fiber communication, it has been widely used. The structure of the light source is described in detail by Ventrudo et al. in Electronics Letters, vol. 30, pp. 2147-2149. However, it is known that, in the coherent collapse mode, the line widths of the spectra are increased to 10-50 GHz. Regarding whether a fundamental in which such spectra are included achieves phase matching using a wavelength conversion device and can be converted with efficiency or not, no known literature is found, and there are many uncertain points.

Figure 2:
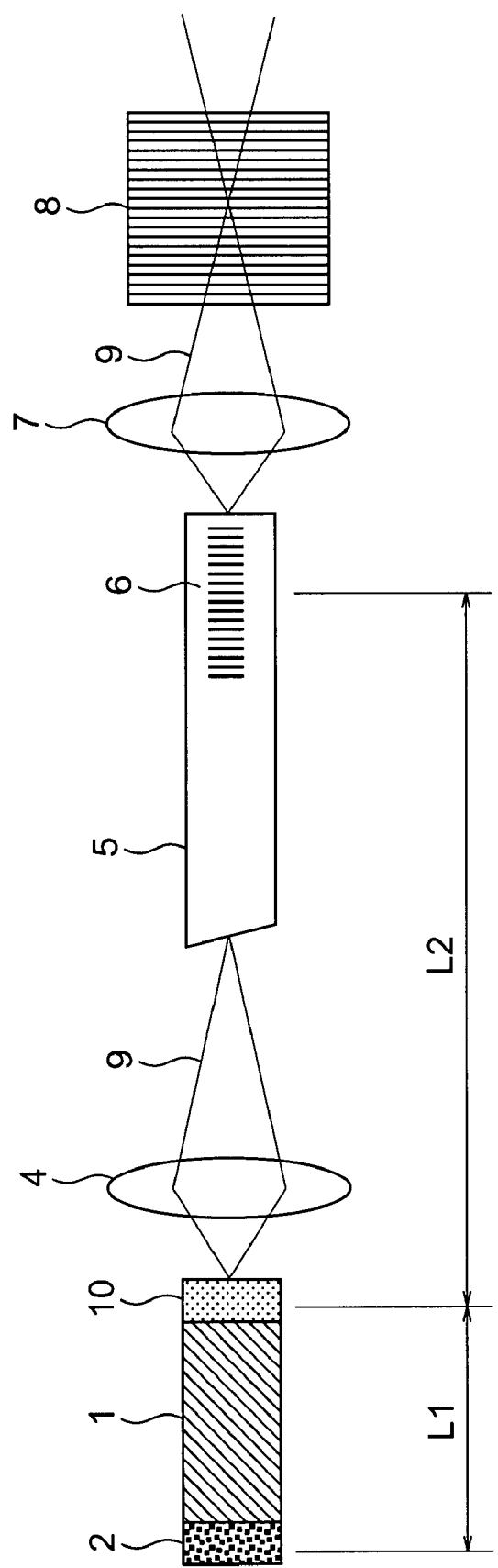
FIG. 2 is a configuration diagram of a wavelength conversion light source according to Embodiment 2 of the present invention.

FIG. 2 is a configuration diagram of a wavelength conversion light source according to Embodiment 2 of the present invention. In Embodiment 2 illustrated in FIG. 2, like numerals are used to designate identical parts in Embodiment 1 illustrated in FIG. 1, and description thereof is omitted. The wavelength conversion light source according to Embodiment 2 illustrated in FIG. 2 is substantially identical to the one illustrated in FIG. 1 except that, instead of the antireflection film 3, a low reflection film 10 is vapor deposited on the front surface of the semiconductor laser diode device 1. In the figure, a length of a first resonator including the high reflection film 2 and the low reflection film 10 is L1, while a length of a second resonator including the low reflection film 10 and the Bragg grating 6 is L2.

As described above, because there are many uncertain points regarding the conversion efficiency in wavelength conversion of a fundamental in the coherent collapse mode, the inventors attempted to compare experiment and calculated values. An experimental system was as illustrated in FIG. 2. The high reflection film 2 having a reflectivity of 90% was vapor deposited on the rear surface of the semiconductor laser diode device 1 having a wavelength of 980 nm and a resonator length L1 of 1.8 mm and the low reflection film 10 having a reflectivity of 0.5% was vapor deposited on the front surface of the semiconductor laser diode device 1 to form a Fabry-Perot laser resonator.

Then, the output light 9 from the front surface which passed through the first lens 4 was optically coupled to the polarization maintaining optical fiber 5 an incidence plane of which was obliquely polished in order to prevent near-end reflection to obtain coupling efficiency of 70%. The core portion of the optical fiber 5 was provided with the Bragg grating 6 having a peak reflectivity and the full width at half maximum of a reflection band of 5% and 0.4 nm, respectively, by being irradiated with ultraviolet light through a phase mask (not shown). Further, the resonator length L2 between the low reflection film 10 and the Bragg grating 6 was made to be 1.5 m which is longer than a coherent length.

As a result, a fundamental light source having a wavelength of 980 nm with which the full width at half maximum of an envelope of the whole spectra in the coherent collapse mode was 0.3 nm was completed. The fundamental was inputted through the second lens 7 to the wavelength conversion device 8 having a periodic domain inversion structure formed therein corresponding to a wavelength of 980 nm in lithium niobate to which 5% of magnesium oxide was added and having a length of length 10 mm.

Figure 3:
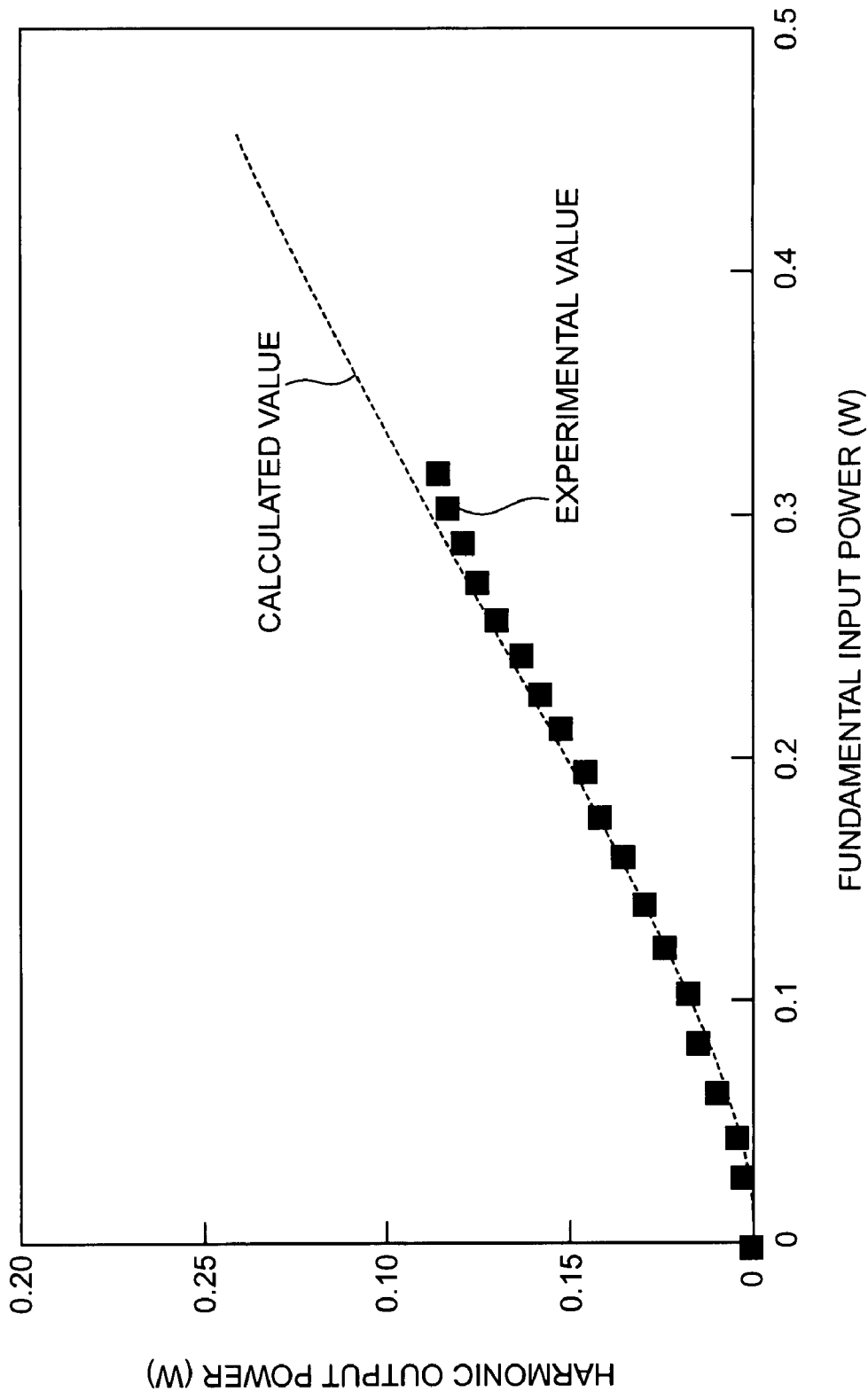
FIG. 3 is a graph of second harmonic output characteristics with respect to fundamental input according to Embodiment 2 of the present invention.

FIG. 3 illustrates result of the experiment and result of calculation of only second harmonic components of spectra having a spectrum width of 0.3 nm (FIG. 3 shows experimental values and calculated values). Because the experimental values and the calculated values almost correspond with each other, wavelength conversion of sum frequency is thought to be very few. It is thought that this is because the coherent collapse mode disturbs the phases of longitudinal modes with feedback light reflected from the Bragg grating 6 disposed at a place farther than the coherent length from the Fabry-Perot resonator. It is thought that, because the phases of spectra having an angular frequency of $\omega-\delta\omega$ and having an angular frequency of $\omega+\delta\omega$, respectively, included in the fundamental randomly fluctuate, even each individual sum frequency is integrated in an optical axis direction, due to the randomness of the phase components, the sum frequency does not increase. Therefore, effects were confirmed that local fluctuations of the conversion efficiency were small and the controllability was improved.

Figure 4:
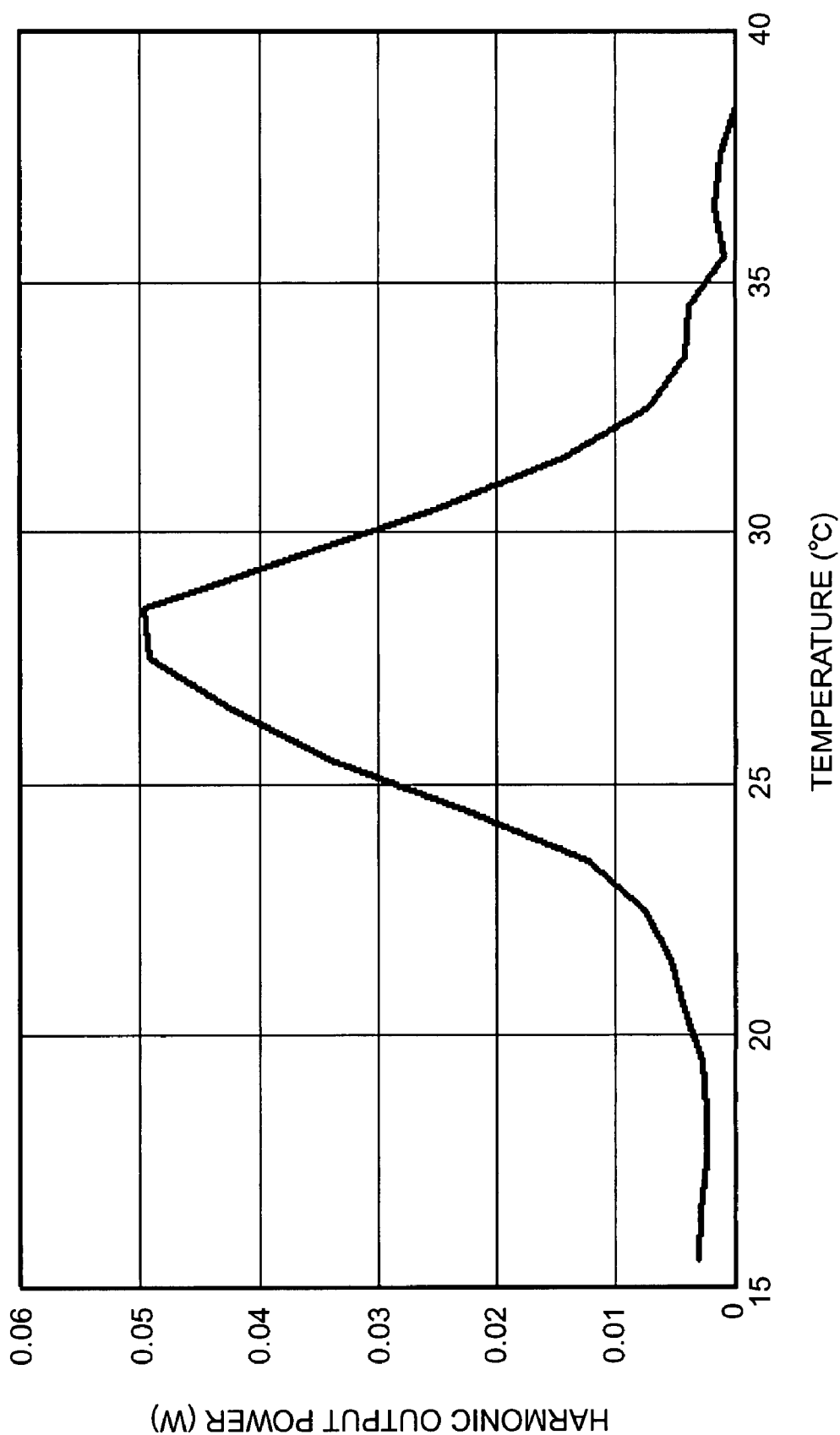
FIG. 4 is a graph of second harmonic output characteristics with respect to a wavelength conversion device temperature according to Embodiment 2 of the present invention.

Further, in measurement of temperature characteristics of the wavelength conversion efficiency illustrated in FIG. 4, special effects were confirmed that the allowable temperature matching range is widened to 5° C.

Therefore, in addition to a characteristic of the coherent collapse mode that changes in the spectrum and in the light intensity of a fundamental with respect to external reflection are small, by adjusting a reflection wavelength range of the Bragg grating 6 provided in the reflected optical fiber 5, the envelope of the spectra of the fundamental is appropriately designed, and thus, the allowable temperature range satisfying the phase-matching conditions of the wavelength conversion device can be enlarged. Further, by combining the semiconductor laser diode device 1, the optical fiber 5 having the Bragg grating 6, and the wavelength conversion device 8, a simple and practical structure can be provided.

Embodiment 3

By the way, in the above-mentioned Embodiment 2, the resonator length L1 of the semiconductor laser diode 1 is 1.8 mm, and thus, the longitudinal mode spacing when the device is singly oscillated as a Fabry-Perot laser is 0.08 nm. The full width at half maximum of the envelope of the spectra in the case where the Bragg grating 6 is used to form a complex resonator and the coherent collapse mode is oscillated is 0.3 nm. Mathematically, three Fabry-Perot modes are thought to exist. It is known that, by using a plurality of Fabry-Perot modes in this way, linearity of light output current characteristics of the coherent collapse mode is improved, and description is made in, for example, JP 09-283847 A.

However, when it is attempted to improve the wavelength conversion efficiency, because the allowable wavelength width of phase matching of the wavelength conversion device 8 having a wavelength of 980 nm and a length of 10 mm is as narrow as 0.1 nm, in order to make a plurality of Fabry-Perot modes included in the spectra in the coherent collapse mode, it is necessary to make the resonator length L1 of the semiconductor laser diode device 1 extremely long, which is practically difficult, or, even if it is possible, a problem is newly caused that unnecessary cost is incurred. Therefore, a practical structure which uses a short semiconductor laser diode device and which makes smaller the spacing of the Fabry-Perot modes is necessary.

Figure 5:
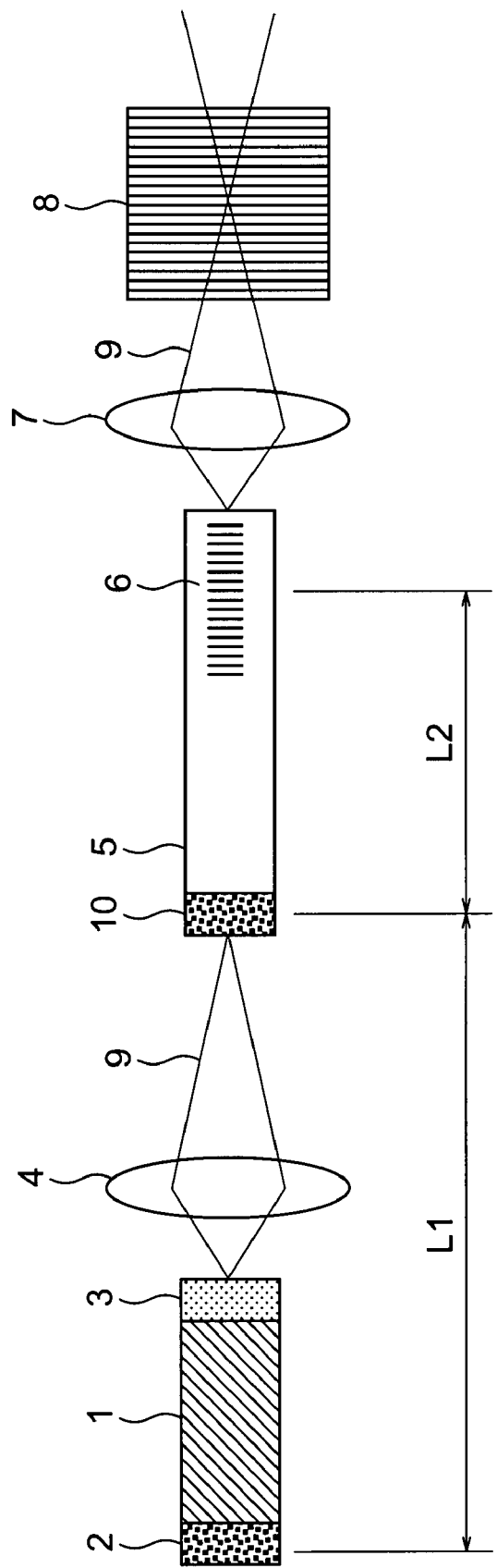
FIG. 5 is a configuration diagram of a wavelength conversion light source according to Embodiment 3 of the present invention.
Figure 6:
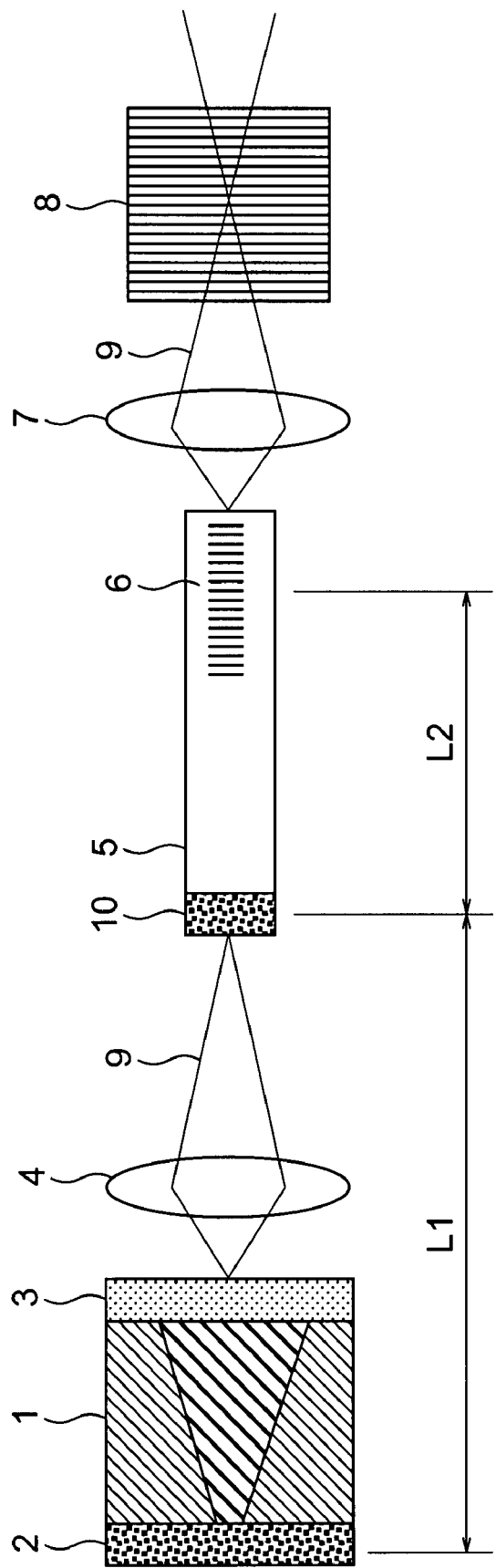
FIG. 6 is a configuration diagram of a wavelength conversion light source according to Embodiment 5 of the present invention.

FIG. 5 is a configuration diagram of a wavelength conversion light source according to Embodiment 3 of the present invention. In FIG. 5, like numerals are used to designate identical parts in Embodiments 1 or 2 illustrated in FIG. 1 or 2, and description thereof is omitted. The wavelength conversion light source according to Embodiment 3 illustrated in FIG. 5 is similar to Embodiment 1 illustrated in FIG. 1 except that the low reflection film 10 is disposed on a light incident surface of the optical fiber 5 having the Bragg grating 6 disposed in the core, and that the semiconductor laser diode device 1 is oscillated in the coherent collapse mode.

According to Embodiment 3, as illustrated in FIG. 5, because the first resonator is formed between the high reflection film 2 and the low reflection film 10, the length L1 of the first resonator can be made long by designing the coupling optical system to be long. Therefore, the spacing of the Fabry-Perot modes can be made smaller, a plurality of Fabry-Perot modes can be disposed in the reflection band of the Bragg grating 6 optimized for the allowable wavelength width of the phase-matching conditions of the wavelength conversion device 8, and a coherent collapse mode with a narrow line width and with less kinks in the light output current characteristics can be obtained. Further, the semiconductor laser diode device 1 can be miniaturized and one with less costs can be formed.

Embodiment 4

In the above-mentioned Embodiment 3, the low reflection film 10 is used on the light incident surface of the optical fiber 5, but measures against reflection such as oblique polishing may be provided at an incidence portion of the optical fiber 5, and a second Bragg grating of low reflectivity may be disposed in a core portion in the vicinity thereof. It is preferable that the reflection bandwidth of the second Bragg grating is larger than the reflection bandwidth of the first Bragg grating 6, and it goes without saying that effects similar to those described above are obtained.

Embodiment 5

In the above-mentioned Embodiments 1-4, the semiconductor laser diode device 1 has an optical waveguide of a single transverse mode, and the maximum light output of continuous wave of approximately 1 W is the limit of optical damage of an end face, and thus, there is a problem in attaining higher output power. Therefore, it is thought to use a flared semiconductor laser diode device in which the active layer and the optical waveguide flare along the direction of light travel. By using such a flared semiconductor laser diode device, the maximum output power of a fundamental can be increased to 3 W or more, and at the same time, effects similar to those of the above-mentioned embodiments are attained.

It should be noted that, although in the above-mentioned Embodiments 1-5, wavelength conversion devices which achieve phase matching by quasi-phase matching with a periodic domain inversion structure are described as the wavelength conversion device 8, the method of the phase matching may use refractive index wavelength dispersion and birefringence.

Further, although in the above-mentioned Embodiments 1-5, the wavelength conversion device 8 is of a bulk type which uses spatial light, it may be provided with an optical waveguide which propagates light of the semiconductor laser diode device 1 in a guided wave mode. Because the brightness of a fundamental can be maintained at a high level, the wavelength conversion efficiency into a second harmonic is improved.

INDUSTRIAL APPLICABILITY

According to the present invention, an allowable temperature range satisfying phase-matching conditions of a wavelength conversion device can be enlarged. Further, a wavelength conversion light source which is stable against ambient conditions can be provided. The wavelength conversion light source is suitable for use as a light source disposed in, for example, an illuminating device, a printing device, a display device, or an optical memory device.

The invention claimed is:

1. A wavelength conversion light source, comprising:
    a semiconductor laser diode device;
    a lens disposed so as to be opposed to the semiconductor laser diode device;
    an optical fiber with a first Bragg grating having a first reflection bandwidth disposed in a core thereof and a second Bragg grating having a second reflection bandwidth larger than the first reflection bandwidth disposed near the first Bragg grating in said core; and
    a wavelength conversion device formed of a nonlinear optical crystal on which light from the semiconductor laser diode device is incident, wherein the semiconductor laser diode device has an antireflection film applied on a front surface thereof, the optical fiber has a low reflection film disposed on a light incident surface thereof, and the semiconductor laser diode device oscillates in a coherent collapse mode.

2. The wavelength conversion light source according to claim 1, wherein the semiconductor laser diode device comprises a flare type semiconductor laser diode device.

3. The wavelength conversion light source according to claim 1, wherein the optical fiber comprises a polarization maintaining optical fiber.

4. The wavelength conversion light source according to claim 1, wherein the wavelength conversion device has a periodic domain inversion structure for quasi-phase matching.

5. The wavelength conversion light source according to claim 1, wherein the wavelength conversion device has an optical waveguide for propagating at least light of the semiconductor laser diode device in a guided wave mode.

6. The wavelength conversion light source according to claim 1, wherein the wavelength conversion device has a refractive index wavelength dispersion structure for phase matching.

7. The wavelength conversion light source according to claim 1, wherein the wavelength conversion device has a birefringence structure for phase matching.

8. The wavelength conversion light source according to claim 1, wherein a distance between the semiconductor laser diode device and the first Bragg grating is set such that the multi-longitudinal mode is included in a predetermined wavelength width satisfying phase-matching conditions of the wavelength conversion device.

9. The wavelength conversion light source according to claim 1, wherein a distance between the low reflection film and the first Bragg grating is larger than a coherent length.

10. A wavelength conversion light source, comprising:
    a semiconductor laser diode device having a high reflection film applied on a rear surface thereof and an antireflection film applied on a front surface thereof;
    a lens disposed so as to be opposed to the semiconductor laser diode device;
    an optical fiber with a first Bragg grating having a first reflection bandwidth disposed in a core thereof, wherein the optical fiber has a low reflection film disposed on a light incident surface thereof, and wherein the reflectivity of the antireflection film is smaller than the reflectivity of the low reflection film; and
    a wavelength conversion device formed of a nonlinear optical crystal on which light from the semiconductor laser diode device is incident, wherein the optical fiber includes a second Bragg grating having a second reflection bandwidth larger than the first reflection bandwidth disposed near the first Bragg grating in said core.

11. The wavelength conversion light source according to claim 10, wherein the semiconductor laser diode device oscillates in a multi-longitudinal mode.

12. The wavelength conversion light source according to claim 10, wherein the semiconductor laser diode device oscillates in a coherent collapse mode.

13. The wavelength conversion light source according to claim 10, wherein the semiconductor laser diode device comprises a flare type semiconductor laser diode device.

14. The wavelength conversion light source according to claim 10, wherein the optical fiber comprises a polarization maintaining optical fiber.

15. The wavelength conversion light source according to claim 10, wherein the wavelength conversion device has a refractive index wavelength dispersion structure or a birefringence structure for phase matching.

16. The wavelength conversion light source according to claim 11, wherein a distance between the semiconductor laser diode device and the first Bragg grating is set such that the multi-longitudinal mode is included in a predetermined wavelength width satisfying phase-matching conditions of the wavelength conversion device.

17. A wavelength conversion light source, comprising:
    a semiconductor laser diode device;
    a lens disposed so as to be opposed to the semiconductor laser diode device;
    an optical fiber with a first Bragg grating having a first reflection bandwidth disposed in a core thereof and a second Bragg grating having a second reflection bandwidth larger than the first reflection bandwidth disposed near the first Bragg grating in said core; and
    a wavelength conversion device formed of a nonlinear optical crystal on which light from the semiconductor laser diode device is incident;
    wherein the semiconductor laser diode device has an antireflection film applied on a front surface thereof and oscillates in a multi-longitudinal mode, and
    wherein a distance between the semiconductor laser diode device and the first Bragg grating is set such that the multi-longitudinal mode is included in a predetermined wavelength width satisfying phase-matching conditions of the wavelength conversion device.

* * * * *